United States Patent
Kim et al.

(10) Patent No.: US 6,788,596 B2
(45) Date of Patent: Sep. 7, 2004

(54) FAILED CELL ADDRESS PROGRAMMING CIRCUIT AND METHOD FOR PROGRAMMING FAILED CELL ADDRESS

(75) Inventors: Jae-Hoon Kim, Suwon (KR); Dong-Il Seo, Yongin (KR); Hyo-Jin Oh, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 38 days.

(21) Appl. No.: 10/347,181

(22) Filed: Jan. 21, 2003

(65) Prior Publication Data

US 2003/0147291 A1 Aug. 7, 2003

(30) Foreign Application Priority Data

Feb. 4, 2002 (KR) ...................................... 2002-006235

(51) Int. Cl.[7] ................................................. G11C 7/00
(52) U.S. Cl. ...................................... 365/200; 365/201
(58) Field of Search ................................ 365/200, 201, 365/230.01, 230.08

(56) References Cited

U.S. PATENT DOCUMENTS 5,576,999 A * 11/1996 Kim et al. .................. 365/200
6,115,828 A * 9/2000 Tsutsumi et al. ............... 714/7
6,597,608 B2 * 7/2003 Kang et al. .................. 365/200

* cited by examiner

Primary Examiner—Anh Phung
(74) Attorney, Agent, or Firm—Harness, Dickey & Pierce P.L.C.

(57) ABSTRACT

A semiconductor memory device and a failed cell address programming circuit usable therein. The semiconductor memory device as packaged includes a memory cell array having a plurality of memory cells accessed by an internal address, a plurality of redundant memory cells accessed by a failed cell address of a failed memory cell for repairing a failed memory cell, a comparator for comparing data output from the memory cells during testing the semiconductor memory device as packaged and generating a comparative correspondence signal, a mode setting register for storing an externally applied failed cell address programming control signal in response to a mode control signal, an address generating circuit for generating the internal address by buffering and latching an externally applied address, a failed cell address programming circuit for latching the internal address output from the address generating circuit in response to the failed cell address programming control signal when the comparative accordance signal indicates that a failed memory cell is detected and programming the failed cell address which is an address for accessing the failed memory cell; and a failed cell address decoding circuit for generating a redundant selection signal when the internal address output from the address generating circuit and the failed cell address output from the failed cell address programming correspond.

20 Claims, 8 Drawing Sheets

FAILED CELL ADDRESS PROGRAMMING CIRCUIT AND METHOD FOR PROGRAMMING FAILED CELL ADDRESS

This U.S. non-provisional patent application claims priority under 35 U.S.C. § 119 of Korean Patent Application 2002-6235 filed on Feb. 4, 2002, the entire contents of both of which are hereby incorporated by reference.

BACKGROUND OF THE INVENTION

1. Field of the Invention

The present invention relates to a semiconductor memory device, and more particularly, to a failed cell address programming circuit and a method for programming a failed cell address for repairing a failed memory cell.

2. Description of Related Art

A semiconductor memory device is usually tested after it is packaged. When a damaged or failed memory cell is found, an address (herein after referred to as a "failed cell address") for accessing the damaged or failed memory cell is stored in an additionally provided device. It is determined whether the failed memory cell can be repaired. If the failed memory cell can be repaired, the failed cell address stored in the additionally provided device is programmed into the semiconductor memory device by applying the failed cell address to a mode setting register.

FIG. 1 is a schematic block diagram of a conventional semiconductor memory device that is disclosed in Korean Patent Application No. 2000-57067 filed in the Korean Patent Office by the same assignee as the present invention.

As shown in FIG. 1, the conventional semiconductor memory device includes a memory cell array 10, a column address decoder 12, a row address decoder 14, a sense amplifier 16, a write amplifier 18, a data input buffer 20, a data output driver 22, a data output buffer 24, a mode setting resistor 26, a failed cell address control signal generating circuit 28, a column address buffer 30, a row address buffer 32, a repaired cell enable control signal generating circuit 34, a repaired cell read/write control circuit 36, a repaired cell 38, switches 40, 41, and a comparator 42.

The operation of the conventional semiconductor memory device of FIG. 1 described below. The memory cell array 10 has a plurality of memory cells for storing data. The data is input to and output from the memory cells in response to a plurality of word line selection signals WL1–WLm from the row address decoder 14 and a plurality of column selection signals Y1–Yn from the column address decoder 12,.

The column address decoder 12 generates a plurality of column selection signals Y1–Yn (n signals) by decoding buffered address CAi, CAiB.

The row address decoder 14 generates a plurality of word line selection signals WL1–WLm (m signals) by decoding buffered row address RAj, RAjB.

The sense amplifier 16 amplifies data output from the memory cell array 10 or transferred from the switch 40 in response to the read enable signal CRE.

The write amplifier 18 amplifies buffered data output from the data input buffer 20 and outputs amplified data to be sent to the memory cell array 10.

The data input buffer 20 buffers data DQ1–DQy and outputs the buffered data. The data output driver 22 drives the data amplified by the sense amplifier 16. The data output buffer 24 buffers the data driven by the data output driver 22 and outputs buffered data DQ1–DQy.

The mode setting register 26 stores a parallel bit test control signal PBT and a failed cell address MRSk, applied externally through input pins (not shown) in response to a mode control signal MRS, and then outputs the parallel bit test control signal PBT and the failed cell address MRSk.

The failed cell address control signal generating circuit 28 generates a failed cell column address PCEi and a failed cell row address PREj in response to the failed cell address MRSk.

The column address buffer 30 buffers the column address of an externally supplied address Ak, applied from address input pins (not shown), latches the column address, and generates buffered column address CAi, CAiB.

The row address buffer 32 buffers the row address of the externally supplied address Ak, applied from the address input pins, latches the row address, and generates buffered row address RAj, RAjB.

The repaired cell enable control signal generating circuit 34 generates a repaired cell enable signal PS when the failed cell column address PCEi and the buffered column address CAi, CAiB correspond, and the failed cell row address PREj and the buffered row address RAj, RAjB correspond.

The repaired cell read/write control circuit 36 generates the repaired cell enable signal PS in response to a control command CONTi and a read command RE, or in response to a control command CONTi and a write command WE. The repaired cell enable signal PS generated by using the control command CONTi and the read command RE is used as a repaired cell read control signal CRE. The repaired cell enable signal PS generated by using the control command CONTi and the write command WE is used as a repaired cell write control signal CWE.

The repaired cell 38 latches the data. The switch 40 is turned on in response to the repaired cell read control signal CRE, thereby transferring the data stored in the repaired cell 38.

The comparator 42 compares data output from the sense amplifier 16 in response to the parallel bit test control signal PBT and generates a comparison result signal.

The switch 44 is turned on in response to the repaired cell write control signal CWE and transfers the data output from the data input buffer 20.

The conventional semiconductor memory device shown in FIG. 1 is electrically tested after it is packaged. After testing, when a failed memory cell is found, a failed cell address, namely, the address of a failed memory cell, is first stored in an external device. The external device programs the failed cell address into a failed cell address control signal generating circuit in the semiconductor memory device. When the address applied through the input pins of the semiconductor memory device during normal operation of the semiconductor memory device matches to the failed cell address, data can be input into or output from a repaired cell instead of the failed memory cell.

That is, when the conventional semiconductor memory device as packaged has a failed memory cell, the address of the failed cell is first stored in the external device, and then the address of the failed cell is programmed into the semiconductor memory device from the external device during repair of the semiconductor memory device.

Accordingly, the conventional semiconductor memory device uses an expensive external device to temporarily store the failed cell address during testing and repairing the packaged semiconductor memory device. As a result, the cost of testing of the semiconductor memory device is increased.

The operation of programming the failed cell address in the conventional semiconductor memory device is described below referring to FIG. 2.

A tester inputs the mode control signal MRS along with the parallel bit test control signal PBT into the semiconductor memory device (Step 100). The parallel bit test control signal PBT applied to the semiconductor memory device is stored in the mode setting register 26.

A parallel bit testing operation is performed on the semiconductor memory device in response to the parallel bit test control signal PBT (Step 110). The parallel bit testing operation includes storing test data for testing the memory cell array 10 in the semiconductor memory device and reading the test data stored in the memory cell array 10 in parallel. The test data output from the memory cell array 10 are transmitted to the tester by a comparator 42.

The tester determines whether the memory cell array 10 being tested is normal (Step 120). When the test data transmitted to the tester indicates comparative consistency, the corresponding memory cell array 10 is determined to be normal, while when the test data indicates comparative inconsistency, the corresponding memory cell array 10 is determined to be abnormal or failed.

If the tester indicates that the tested memory cell array 10 is abnormal or failed, an address of a failed memory cell referred to as a failed cell address is stored in an external device (Step 130).

When the tester indicates that the tested memory cell array 10 is normal in step 120, it is determined whether the parallel bit testing operation has been performed on all cells of the memory cell array (Step 140).

If no in step 140, steps 110–130 are repeated, while if yes, in step 140, the tester determines whether the failed memory cells can be repaired (Step 150).

When the tester determines that the failed memory cells can be repaired, the mode control signal MRS and the failed cell address are input to the semiconductor memory device from the external device (Step 160). The failed cell address is stored in the mode setting register 26 in response to the mode control signal and the failed cell address is written into a failed cell address control signal generating circuit 28.

When it is determined that the failed memory cell can not be repaired, the test completed semiconductor memory device is discarded (Step 210).

After the failed cell address is programmed into the failed cell address control signal generating circuit 28 in the semiconductor memory device, the mode control signal MRS and the parallel bit test control signal PBT are input again to the corresponding semiconductor memory device that has been repaired (Step 170).

The repaired semiconductor memory device again undergoes the parallel bit testing in response to the parallel bit test control signal PBT (Step 180).

The tester determines whether the parallel bit testing for all memory cell arrays in the repaired semiconductor memory device is completed (Step 190).

If the tester indicates that the parallel bit testing is not completed, steps 180–190 are repeated, and if the parallel bit testing is completed, the tester determines whether the repaired semiconductor memory device is normal or not (Step 200).

When the tester determines that the repaired semiconductor memory device is normal, the repaired semiconductor memory device is commercialized.

As discussed above, an expensive external device may be used for testing and repairing a conventional semiconductor memory device. Therefore, the cost of testing the semiconductor memory device may be increased.

SUMMARY OF THE INVENTION

In an exemplary embodiment, the present invention is directed to a semiconductor memory device capable of being repaired without using an additional external device during testing and repairing the packaged semiconductor memory device.

In an exemplary embodiment, the present invention is directed to a failed cell address programming circuit employed in a semiconductor memory device for programming an address of a failed memory cell into the semiconductor memory device.

In an exemplary embodiment, the present invention is directed to a method of programming the failed cell address into the packaged semiconductor memory device.

In an exemplary embodiment, the present invention is directed to a semiconductor memory device, comprising a memory cell array having a plurality of memory cells accessed by an internal address; a plurality of redundant memory cells accessed by a failed cell address of a failed memory cell, the redundant memory cells being used for repairing the failed memory cell; a comparator for comparing data output from the memory cells during testing the semiconductor memory device as packaged and for generating a comparative output signal; a mode setting register for storing a failed cell address programming control signal in response to a mode control signal; an address generating circuit for generating the internal address by buffering and latching an externally applied address; a failed cell address programming circuit for latching the internal address output from the address generating circuit in response to the failed cell address programming control signal when the comparative output signal indicates that a failed memory cell is detected in the semiconductor memory device and programming the latched internal address as the failed cell address; and a failed cell address coding circuit for generating a redundant memory cell selection signal when the internal address output from the address generating circuit and the failed cell address output from the failed cell address programming circuit correspond, wherein the redundant memory cell is accessed in response to the redundant memory cell selection signal.

In an exemplary embodiment, the present invention is directed to a failed cell address programming circuit of a semiconductor memory device having a memory cell array having a plurality of memory cells accessed by an internal address, a plurality of redundant memory cells accessed by a failed cell address of a failed memory cell, a comparator for generating a comparative output signal after comparing data output from the memory cell array during testing the semiconductor memory device as packaged and an address generator for generating the internal address by buffering and latching an externally applied address, said failed cell address programming circuit comprising a mode setting register for storing a failed cell address latching control signal and a programming control signal which are externally applied in response to a mode control signal; failed cell address latching means for latching address output from the address generator in response to the failed cell address latching control signal when the comparative output signal indicates that at least one of the memory cells has failed; and failed cell address programming means for programming the address output from the failed cell address latching means in response to the programming control signal.

In an exemplary embodiment, the present invention is directed to a method for programming a failed cell address of a failed memory cell of a memory cell array with a plurality of memory cells accessed by an internal address, a plurality of redundant memory cells accessed by the failed cell address, a comparator for generating a comparative output signal after comparing data output from the memory cell array during testing of the semiconductor memory device as packaged and an address generator for generating the internal address by buffering and latching an externally applied address, said method comprising: latching the internal address output from the address generator in response to the failed cell address latching control signal when the comparative output signal indicates that at least one memory cell has failed; and programming the internal address which is latched in response to the programming control signal.

In an exemplary embodiment, the present invention is directed to a semiconductor memory device, comprising: a failed cell address programming circuit for latching an internal address from an address generating circuit in response to a failed cell address programming control signal when a failed memory cell is detected and programming the latched internal address as the failed cell address; and a failed cell address coding circuit for generating a redundant memory cell selection signal when an internal address and the failed cell address output from the failed cell address programming circuit correspond, wherein a redundant memory cell is accessed in response to the redundant memory cell selection signal.

In an exemplary embodiment, the present invention is directed to a failed cell address programming circuit, comprising: failed cell address latching means for latching an address output from an address generator in response to a failed cell address latching control signal when at least one of the memory cells has failed; and failed cell address programming means for programming the address output from the failed cell address latching means in response to the programming control signal.

In an exemplary embodiment, the present invention is directed to a method for programming a failed cell address of a failed memory cell of a memory cell array with a plurality of memory cells and a plurality of redundant memory cells accessed by the failed cell address, said method comprising: latching an internal address output from an address generator in response to a failed cell address latching control signal when at least one memory cell has failed; and programming the internal address which is latched in response to the programming control signal.

BRIEF DESCRIPTION OF THE DRAWINGS

For more complete understanding of the present invention and the advantages thereof, reference is now made to the following descriptions taken in conjunction with the accompanying drawings, in which like reference numerals denote like parts, and in which.

DETAILED DESCRIPTION OF EXEMPLARY EMBODIMENTS

Reference will now be made in detail to exemplary embodiments of the present invention, example of which is illustrated in the accompanying drawings.

Figure 3:
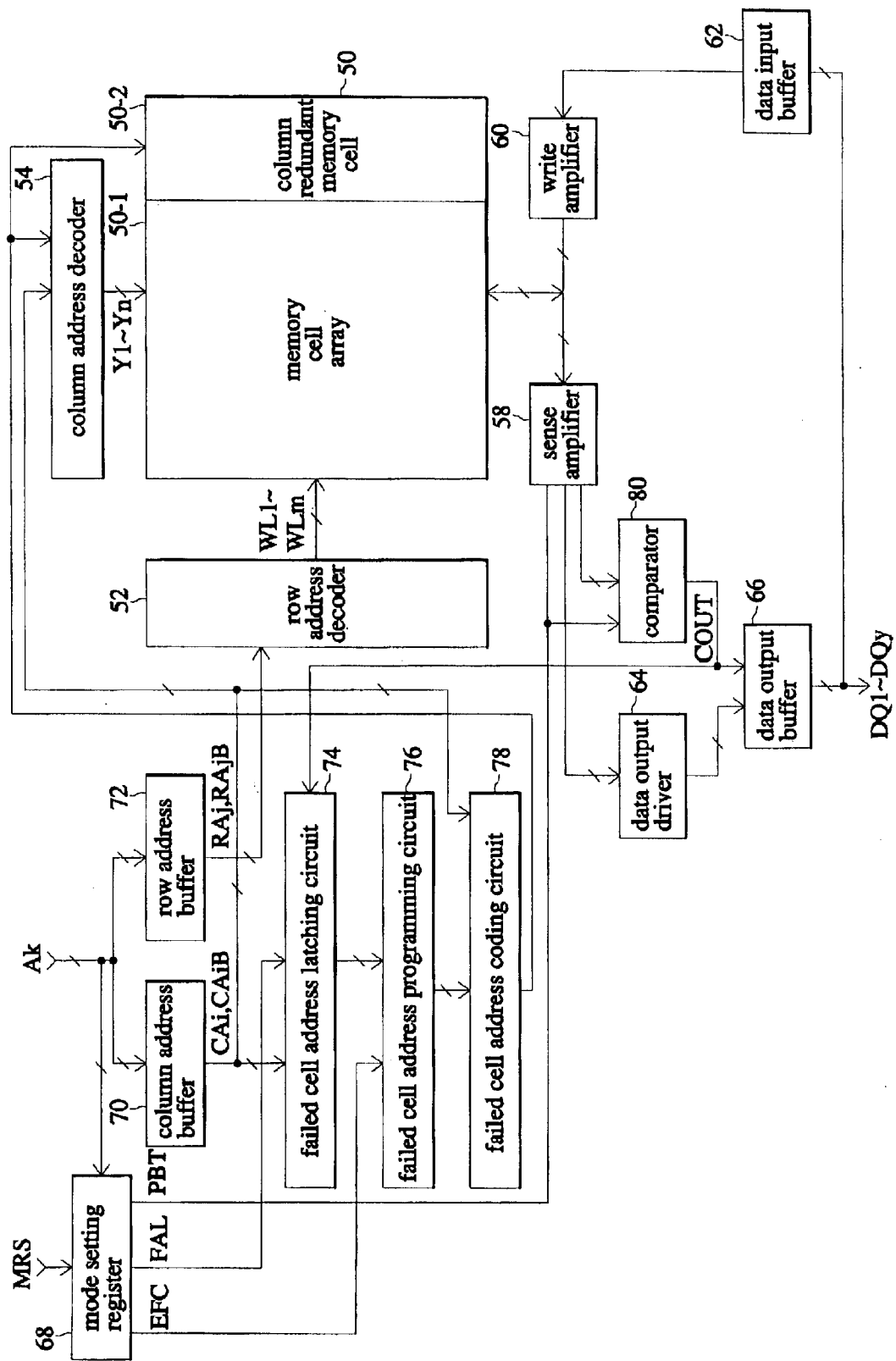
FIG. 3 is a block diagram of a semiconductor memory device in accordance with an exemplary embodiment of the present invention.

FIG. 3 is a block diagram of a semiconductor memory device in accordance with an exemplary embodiment of the present invention.

As shown in FIG. 3, the semiconductor memory device is packaged and includes a memory cell array 50 having a normal memory cell array 50-1 and a column redundant memory cell array 50-2. The semiconductor memory device further includes a row address decoder 52, a column address decoder 54, a sense amplifier 58, a write amplifier 60, a data input buffer 62, a data output driver 64, a data output buffer 66, a mode setting register 68, a column address buffer 70, a row address buffer 72, a failed cell latching circuit 74, a failed cell programming circuit 76, a failed cell address coding circuit 78 and a comparator 80.

Figure 1:
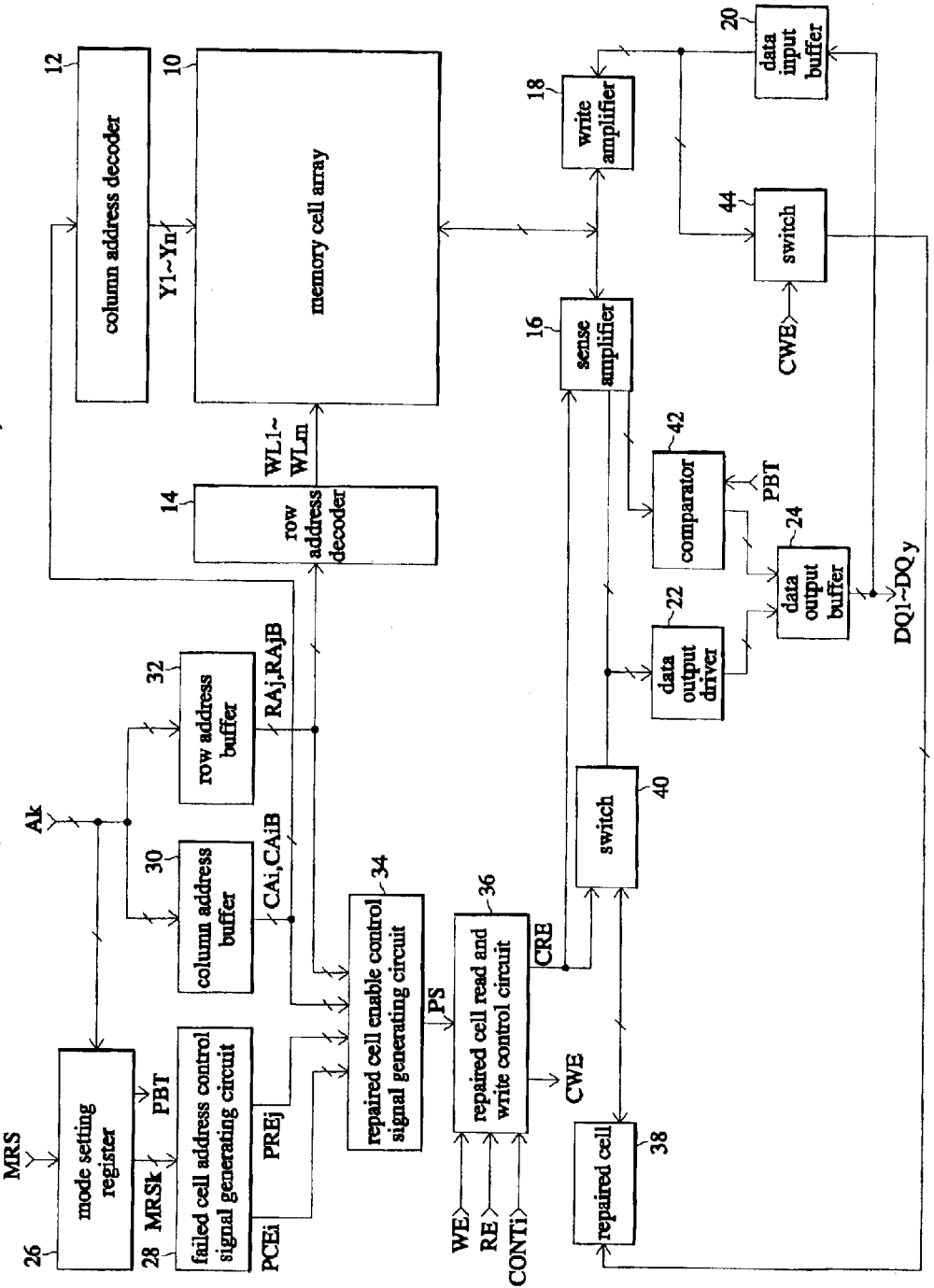
FIG. 1 is a schematic block diagram of a semiconductor memory device in accordance with the conventional art.
Figure 2:
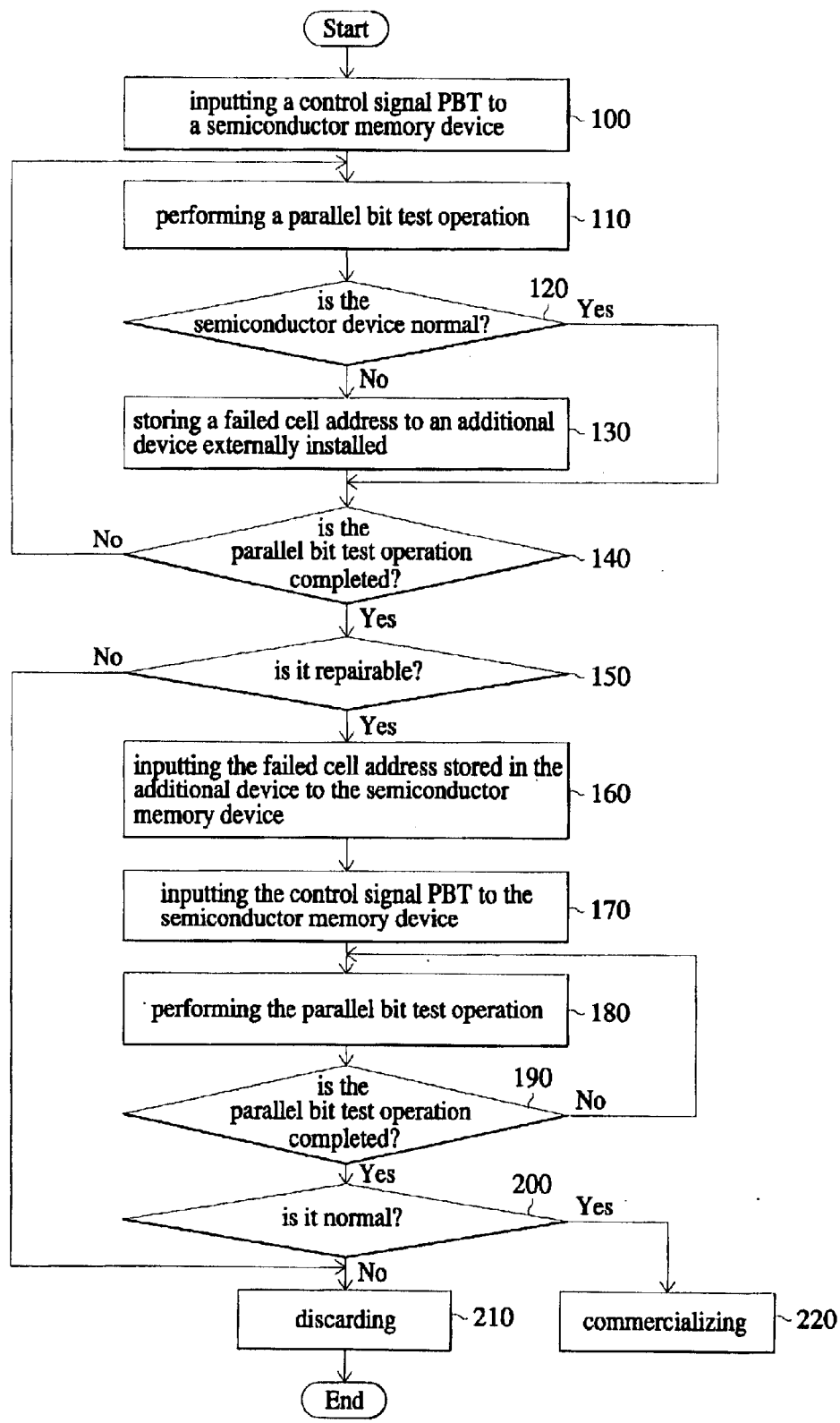
FIG. 2 is a flow chart showing a method of testing and repairing the semiconductor memory device in accordance with the conventional art.

The memory cell array 50, the row address decoder 52, the column address decoder 54, the sense amplifier 58, the write amplifier 60, the data input buffer 62, the data output driver 64, the data output buffer 66 and the comparator 80 have substantially the same function as the corresponding elements referred as the same name in FIG. 1. Accordingly, explanation of the function thereof will be omitted.

The mode setting register 68 receives externally applied signals through address input pins of the semiconductor memory device in response to a mode control signal MRS, and generates a program control signal EFC, a failed cell address latching control signal FAL and a parallel bit test control signal PBT.

The column address buffer 70 buffers and latches a column address of an externally supplied address Ak, and then generates a buffered column address CAi, CAiB. The row address buffer 70 buffers and latches a row address of an externally supplied address Ak, and then generates a buffered row address RAi, RAiB.

The failed cell address latching circuit 74 outputs the buffered column address CAi, CAiB in response to an output signal of the comparator 80 and the failed cell address latching control signal FAL. The failed cell address programming circuit 76 programs the failed cell address output from the failed cell address latching circuit 74 in response to the program control signal EFC.

The failed cell address coding circuit 78 generates a redundant column selection signal RY when the programmed cell address corresponds to the buffered column address CAi, CAiB. The column address decoder 54 may be disabled in response to the redundant column selection signal RY In the semiconductor memory device of FIG. 3, the memory cell array 50-1 has a plurality of memory cell columns and each of the columns is accessed by a column selection signal of the column selection signals Y1–Yn. When the semiconductor memory device has a column including at least one failed memory cell, the column including the failed memory cell is replaced with a redundant column that is comprised of a plurality of redundant memory cells 50-2 and accessed by the redundant column selection signal RY. That is, the semiconductor memory device is repaired column by column. In another exemplary embodiment, the semiconductor memory device can be repaired cell by cell.

Figure 4:
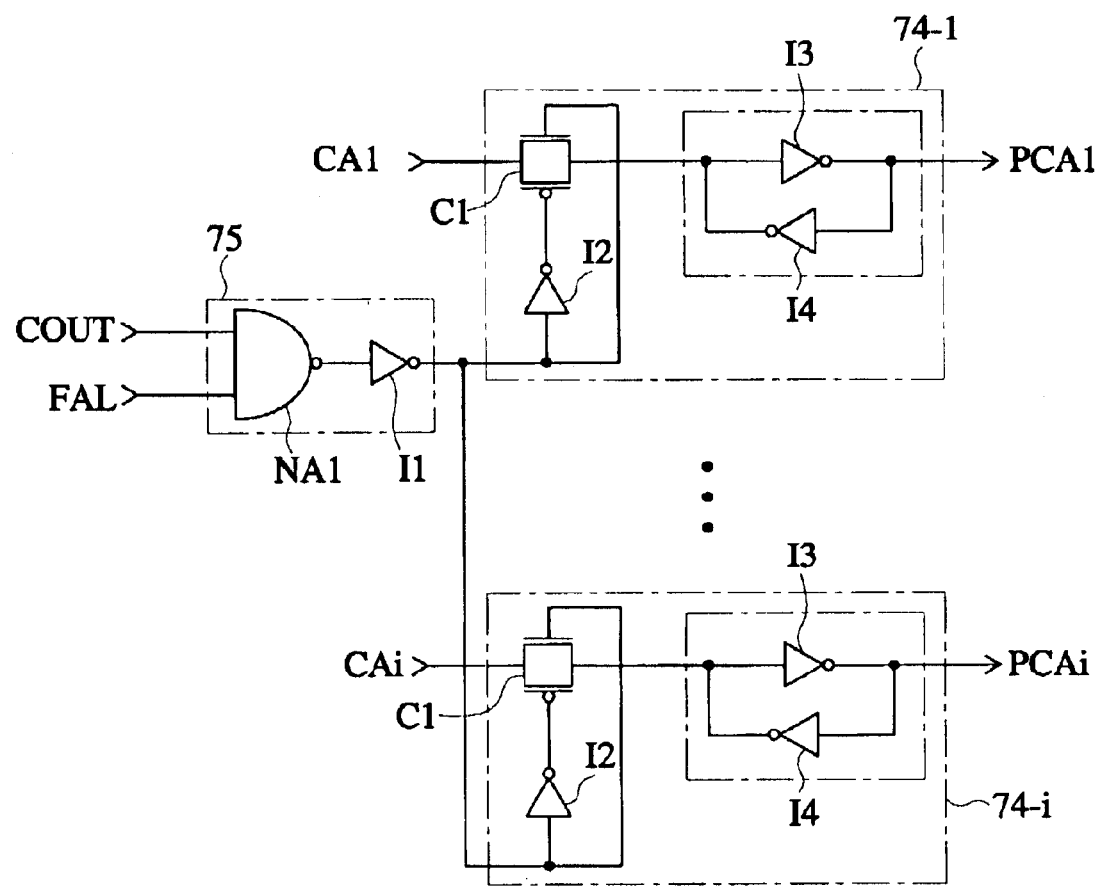
FIG. 4 is an exemplary circuit diagram of a failed cell address latching circuit illustrated in FIG. 3 in accordance with an exemplary embodiment of the present invention.

FIG. 4 is an exemplary circuit diagram of the failed cell address latching circuit 74 in an exemplary embodiment of the present invention. As shown in FIG. 4, each of the failed cell address latching circuits 74-1–74-i comprises a latching control signal generating circuit 75 comprised of a NAND gate NA1 and an inverter I1 and a latching element L comprised of a CMOS transmitting gate C1, an inverter I2 and inverters I3 and I4.

The latching control signal generating circuit 75 generates a logic "high" level of latching control signal when an output signal COUT of the comparator 80 and the failed cell latching control signal FAL have a logic "high" level.

The CMOS transmitting gate C1 is turned on in response to a logic "high" level of the failed cell address latching control signal FAL, and transfers the failed cell address CA1–CAi. The latching element L in each of the address latching circuits 74-1–74-i latches an output signal of the CMOS transmitting gate C1 and generates the failed cell address output signals PCA1–PCAi.

Figure 5:
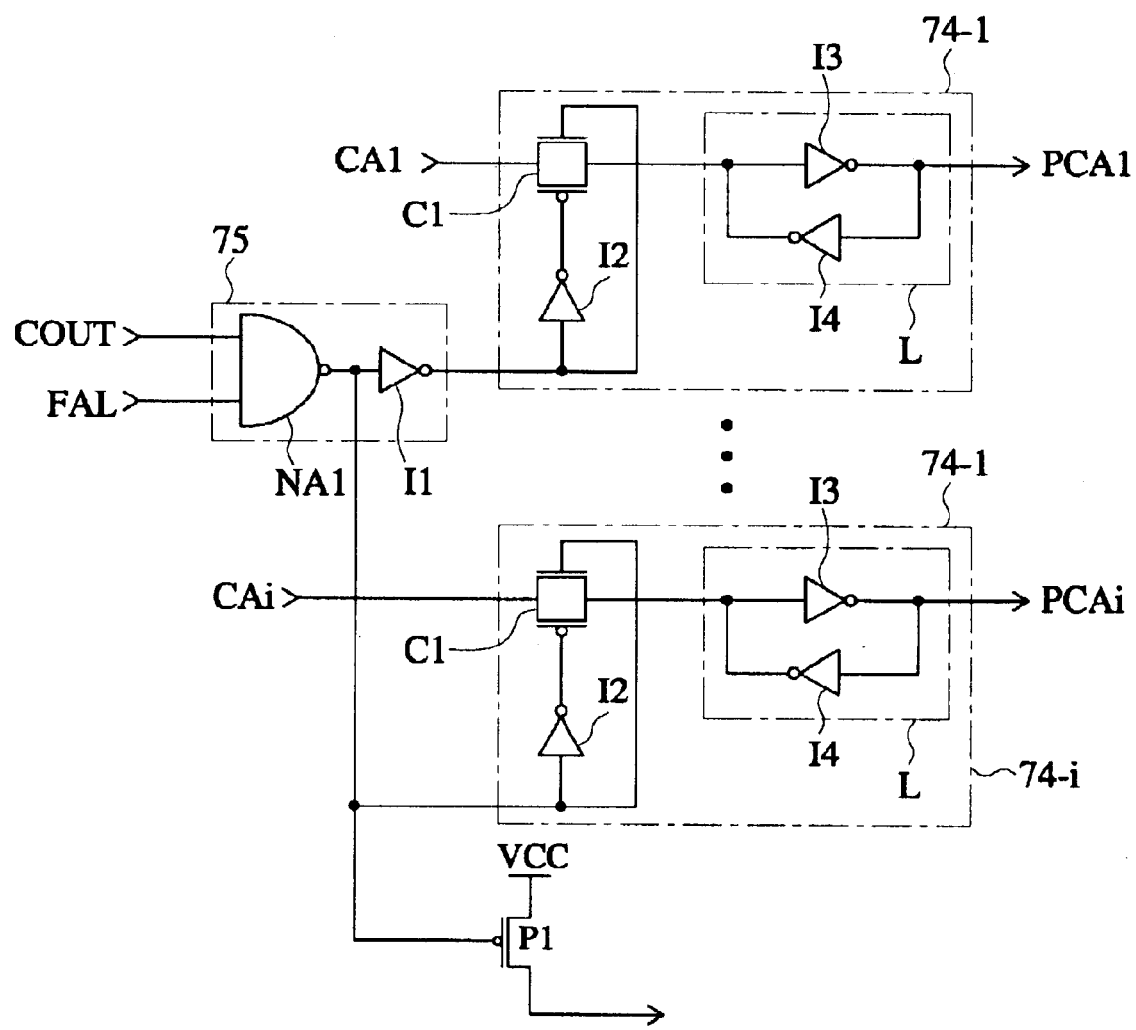
FIG. 5 is another exemplary circuit diagram of the failed cell address latching circuit illustrated in FIG. 3, in accordance with an exemplary embodiment of the present invention.

FIG. 5 is another exemplary circuit diagram of the failed cell address latching circuit 74 in accordance with an exemplary embodiment of the present invention. As shown in FIG. 5, the failed cell address latching circuit further comprises a PMOS transistor in addition to the elements shown in FIG. 4.

The elements designated by like reference numbers in FIG. 4 and FIG. 5 are like elements and therefore operated in substantially the same way. Accordingly, a discussion thereof in conjunction with FIG. 5 is omitted.

The PMOS transistor P1 is turned on when an output signal of the NAND gate NA1 is a logic "low" level, thereby transferring a logic "high" level signal. Then, the transferred logic "high" level signal is input to a tester via a pin of the semiconductor memory device, whereby the tester can detect that the failed cell address latching circuit is being used. That is, the tester determines whether the semiconductor memory device can be repaired using a combined signal that is transmitted by the PMOS transistor P1 and generated by combining the failed cell address latching control signal and the comparative output signal. Accordingly, the combined signal may be considered a repair start signal.

Figure 6:
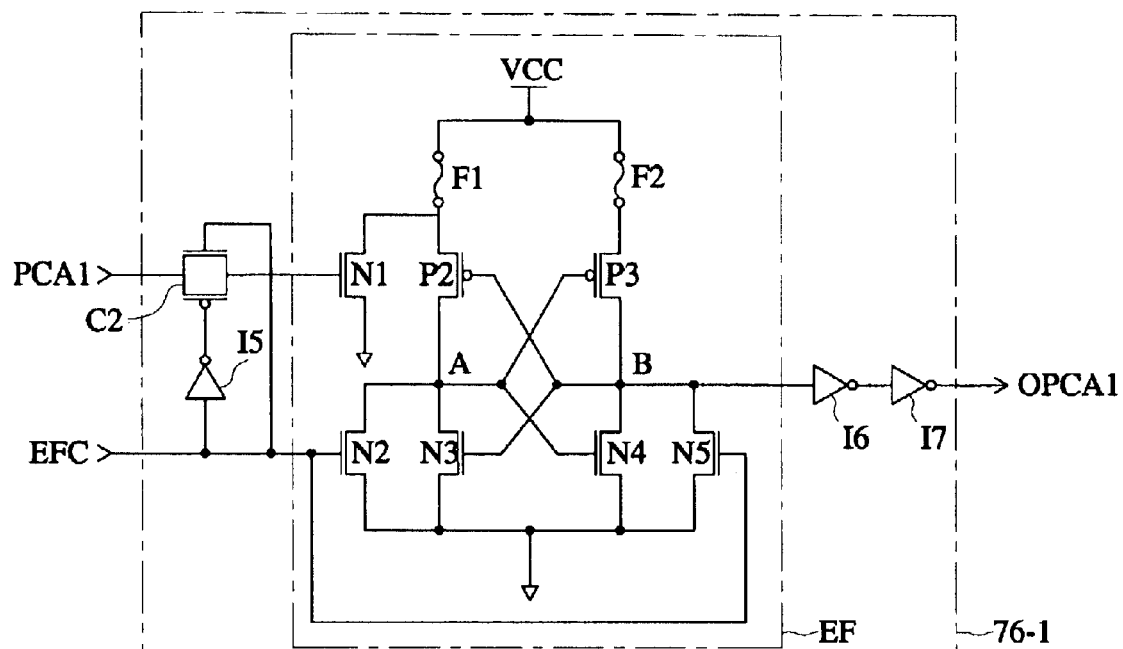
FIG. 6 is a circuit diagram of a failed cell address programming circuit illustrated in FIG. 3, in accordance with an exemplary embodiment of the present invention.
Figure 6:
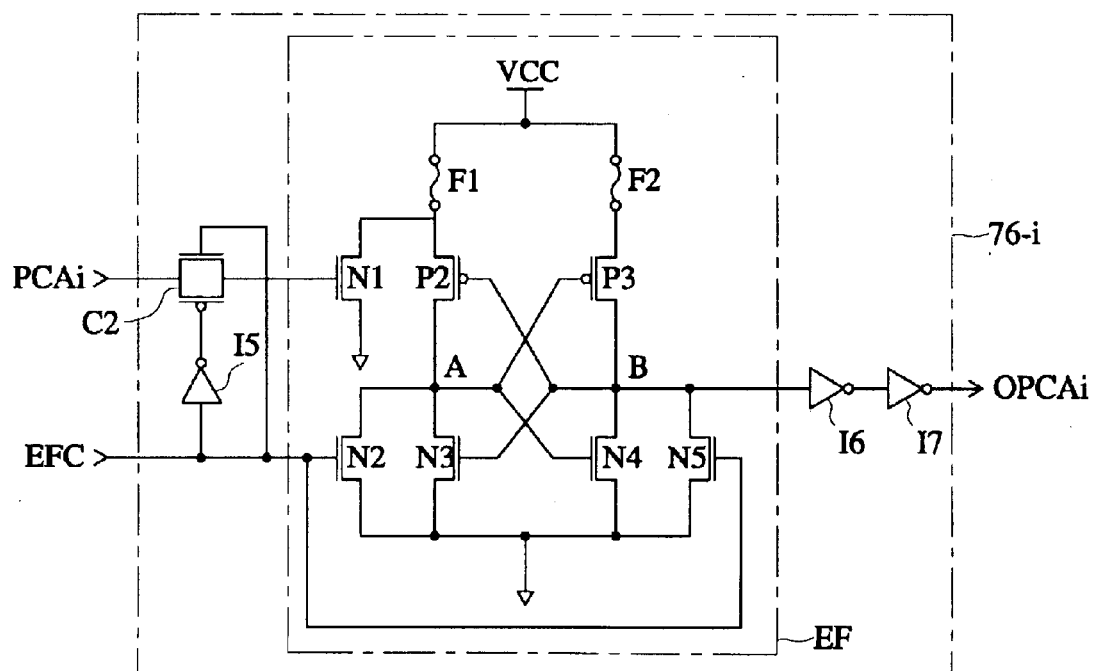

FIG. 6 is an exemplary circuit diagram of the failed cell address programming circuit 76 in accordance with an exemplary embodiment of the present invention. As shown in FIG. 6, the failed cell address programming circuit includes a plurality of failed cell control signal generators 76-1–76-i. Each of the failed cell control signal generators 76-1–76-i includes a CMOS transmitting gate C2, inverters I5, I6, I7 and an electrical fuse circuit EF each of which is comprised of NMOS transistors N1, N2, N3, N4, N5, PMOS transistors P2, P3 and fuses F1, F2. In FIG. 6, the fuse F2 has relatively lower resistance than that of the fuse F1.

Operation of the failed cell address programming circuit 76-1 is discussed below. When a logic "high" level of the programming control signal EFC is applied to the failed cell control signal generator 76-1, the CMOS transmitting gate C2 is turned on. At this time, when a logic "low" level of the failed cell output signal PCA1 is input to the failed cell control signal generator 76-1, the NMOS transistor N1 is turned off, so that the fuse F1 is not blown. Then, the NMOS transistors N2, N5 are turned on in response to the logic "high" level of the programming control signal EFC, and a voltage potential at a node A becomes slightly greater than that at a node B. Accordingly, the output signal OPCA1 having a logic "low" level is output from the failed cell control signal generator 76-1 through the inverters I6, I7.

When a logic "high" level of the programming control signal EFC and a logic "high" level of the failed cell output signal PCA1 are applied to the failed cell control signal generator 76-1, the NMOS transistor N1 is turned on and the fuse F1 is blown. Then, the NMOS transistors N2, N5 are turned on in response to the logic "high" level of the programming control signal EFC, and a voltage potential at a node A is lowered to be slightly lower than that at a node B. Accordingly, the output signal OPCA1 having a logic "high" level is output from the failed cell control signal generator 76-1 through the inverters I6, I7.

That is, the failed cell address programming circuits 76-1–76-i generate a logic "low" level of the output signals OPCA1–OPCAi, respectively in response to a logic "high" level of the programming control signal EFC when a logic "high" level of the failed cell address output signals PCA1–PCAi are transmitted thereto, respectively. Further, the failed cell address programming circuits 76-1–76-i generate a logic "high" level of the output signals OPCA1–OPCAi, respectively in response to a logic "high" level of the programming control signal EFC when a logic "low" level of the failed cell address output signals PCA1–PCAi, respectively, are transmitted thereto.

As discussed above, a level of the output signals OPCA1–OPCAi output from the failed cell control signal generator 76-1–76-i may be repaired.

Figure 7:
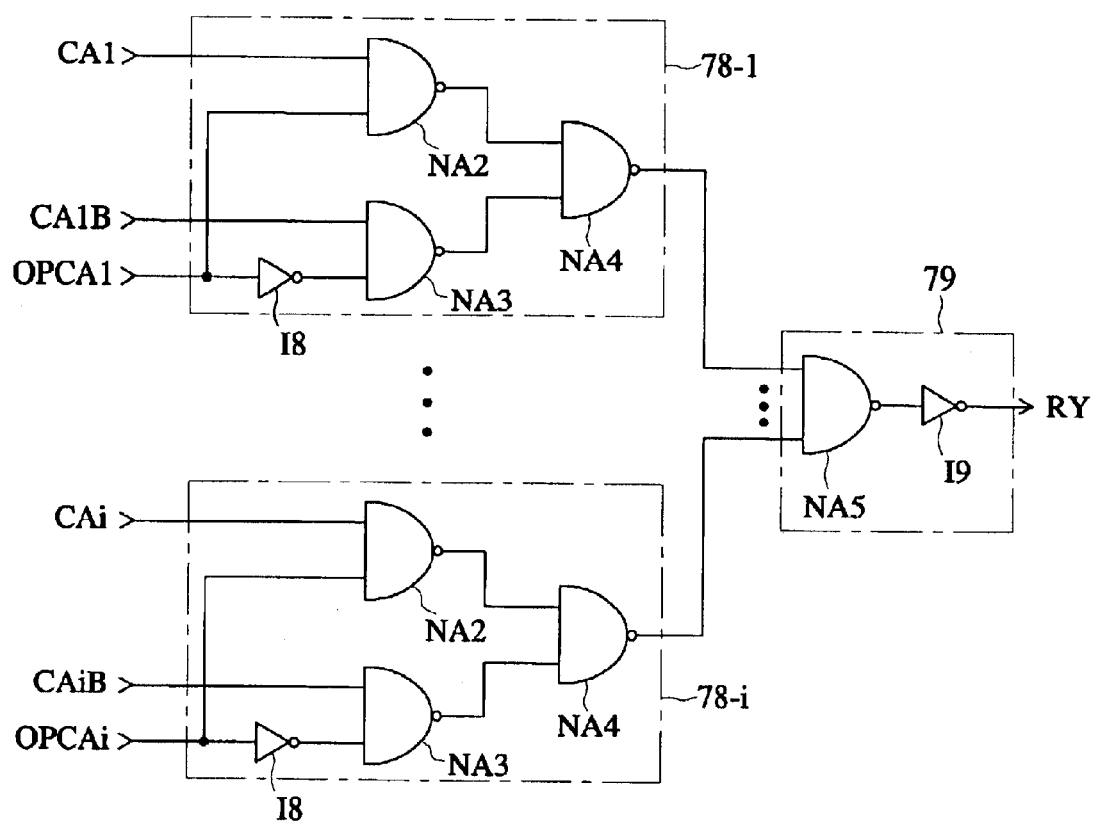
FIG. 7 is a circuit diagram of a failed cell address coding circuit illustrated in FIG. 3, in accordance with an exemplary embodiment of the present invention.

FIG. 7 is a circuit diagram of the failed cell coding circuit 78 in accordance with an exemplary embodiment of the present invention. As shown in FIG. 7, the failed cell coding circuit 78 includes a redundant column selection signal generating circuit 79 including a NAND gate N5 and an inverter I9, and a failed cell address coder 78-1–78-I, each having an inverter I8 and NAND gates NA2, NA3, NA4.

When the output signal OPCA1 is a logic "high" level, the NAND gate N2 inverts and outputs the buffered column address CA1, and the NAND gate N3 inverts and outputs an inverted buffered column address CAIB. The NAND gate N4 NANDs output signals of the NAND gates NA2 and NA3 and generates a comparative output signal COM1.

As a result, when the output signal OPCA1 is a logic "high" level and the buffered column address PCA1 is a logic "high" level, the comparative output signal COM1 has a logic "high" level. Further, when the output signal OPCA1 is a logic "high" level and the buffered column address PCA1 is a logic "low" level, the comparative output signal COM1 has a logic "low" level.

When the output signal OPCA1 is a logic "low" level, the NAND gate NA2 inverts and outputs the buffered inverted column address CA1B, and the NAND gate NA3 inverts and outputs the buffered column address CA1. The NAND gate NA4 NANDs output signals of the NAND gates NA2 and NA3 and generates the comparative output signal COM1.

As a result, when the output signal OPCA1 is a logic "low" level and the buffered column address CA1 is a logic "high" level, the comparative output signal COM1 has a logic "low" level. When the output signal OPCA1 is a logic "low" level and the buffered column address CA1 is a logic "low" level, the comparative output signal COM1 has a logic "high" level.

The redundant column selection signal generating circuit 79 generates a redundant column selection signal RY with a logic "high" level when all of the comparative output signals COM1–COMi have logic "high" levels, and generates the redundant column selection signal RY with a logic "low" level when at least one comparative output signal of the comparative output signals COM1–COMi is has a logic "low" level.

That is, the failed cell address is directly programmed in the packaged semiconductor memory device without using an external device that is used for temporarily storing the failed cell address for repairing the packaged conventional semiconductor memory device.

Figure 8:
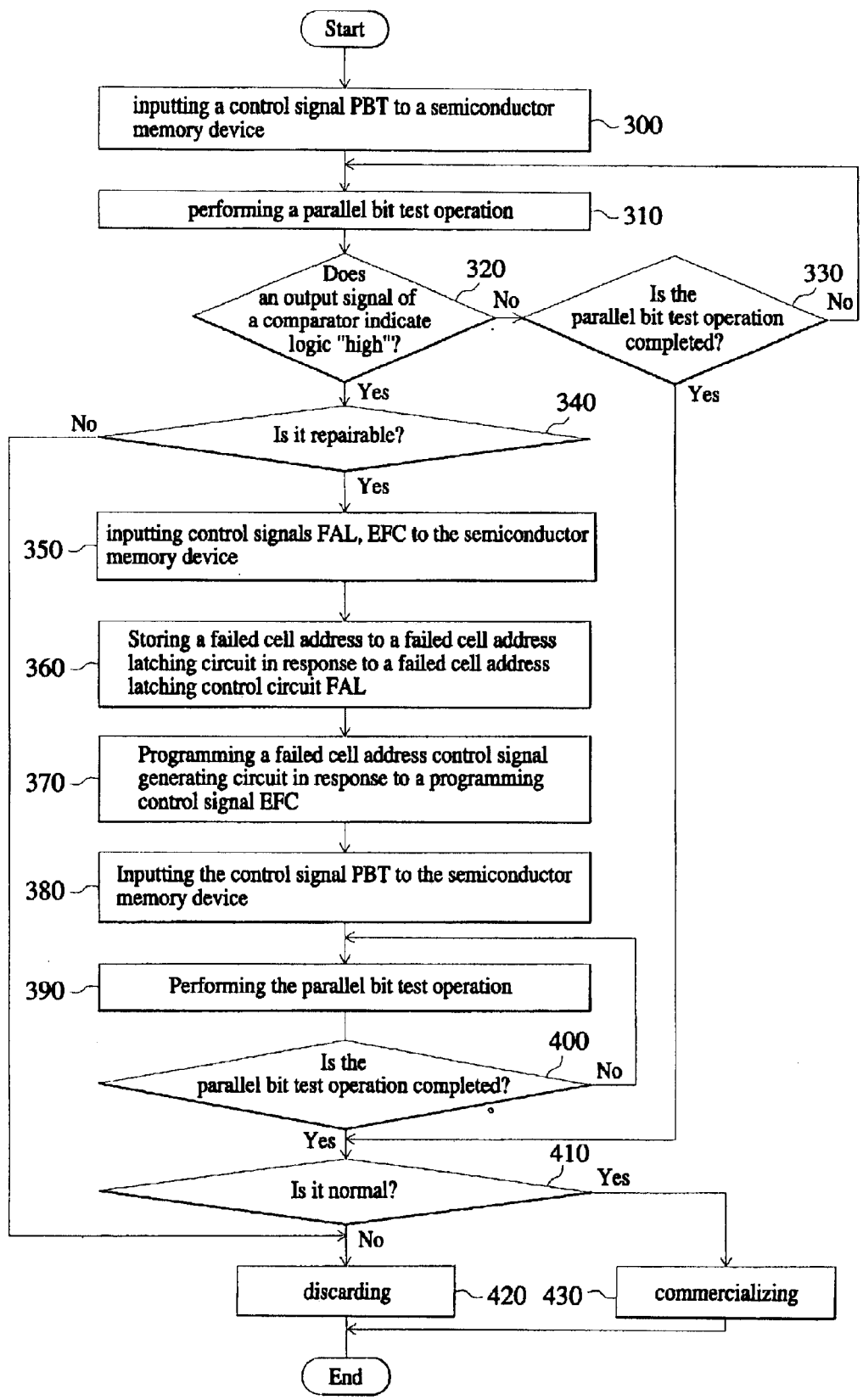
FIG. 8 is a flow chart showing a method of programming the failed cell address in a semiconductor memory device in accordance with an exemplary embodiment of the present invention.

A method of programming the failed cell address into the semiconductor memory device in accordance with an exemplary embodiment of the present invention will be described below with reference to FIG. 8.

A tester inputs a mode control signal MRS and a parallel bit test control signal PBT to a packaged semiconductor memory device (Step 300). The parallel bit test control signal PBT is stored in a mode setting register 68 in the packaged semiconductor memory device in response to the mode control signal MRS. A parallel bit test operation is performed against the packaged semiconductor memory device (Step 310).

During the parallel bit test operation, the tester determines whether a comparator 80 in the packaged semiconductor memory device outputs logic "high" level of an output signal (Step 320). That is, the tester determines whether the packaged semiconductor memory device has a failed memory cell using the output signal of the comparator 80.

When the comparator 80 outputs logic a "low" level of the output signal in the step 320, the tester determines in step 330 whether the test for all memory cells in the packaged semiconductor memory device is complete. If not, at step 330, steps 310–320 are repeated. If yes, in step 330, step 410 is performed.

When the comparator 80 outputs logic the output signal in step 320 with a "high" level, the tester determines whether the packaged semiconductor memory device can be repaired (Step 340).

The semiconductor memory device can be repaired when the failed cell latching control signal generated by the failed cell address latching circuit shown in FIG. 5 transits from logic a "low" level to a logic "high" level. If the semiconductor memory device has the failed cell address latching circuit shown in FIG. 4, step 320 may be omitted.

If the packaged semiconductor memory device can not be repaired in step 340, the test completed semiconductor memory device is discarded and if the packaged semiconductor memory device can be repaired in step 340, the tester inputs the mode control signal MRS, the failed cell address latching control signal FAL and a programming control signal EFC to the semiconductor memory device (Step 350). The mode setting register 68 in the semiconductor memory device receives the failed cell address latching control signal FAL and the programming control signal EFC.

The failed cell address latching circuit 74 in the packaged semiconductor memory device programs the failed cell address in response to the failed cell address latching control signal FAL (Step 360). The failed cell address programming circuit 76 programs the failed cell address in response to the programming control signal EFC (Step 370). The tester transmits the mode control signal MRS and the parallel bit test control signal PBT to the semiconductor memory device (Step 380). The parallel bit test operation for the repaired semiconductor memory device is performed in response to the parallel bit test control signal PBT (Step 390).

It is then determined whether the parallel bit test operation for all memory cells in the repaired semiconductor memory device is completed (Step 400). If not, step 390 is repeated. If yes in step 400, it is determined whether the repaired semiconductor memory device is normal (Step 410). If yes in step 410, the test completed semiconductor memory device is commercialized (Step 430) and if not, the test completed semiconductor is discarded. (Step 420)

As a result, if the semiconductor memory device in accordance with exemplary embodiments of the present invention has a failed memory cell, an address to access the failed memory cell (a failed cell address), is stored in a failed cell address latching circuit 74 in the semiconductor memory device and then programmed in the failed cell programming circuit 76.

The exemplary embodiments of the present invention as discussed above disclose repairing the semiconductor memory device column by column but exemplary embodiments of the present invention may also include repairing the semiconductor memory device row by row or cell by cell.

Further, the structure of the redundant memory cell of the exemplary embodiments of the present invention described above is not limited to the structure discussed above, but may be modified as would be known to one of ordinary skill in the art.

The exemplary embodiments of the present invention describe repairing one bit of a failed memory cell but the present invention may be also applied to a method of repairing a plurality of bits of failed memory cells.

Further, exemplary embodiments of the present invention may be applied to a semiconductor memory device having a plurality of memory cell arrays, each of which has a plurality of memory banks, wherein the parallel bit test is performed for a plurality of memory banks at the same time.

While the invention has been particularly shown and described with reference to exemplary embodiments thereof, it will be understood by those skilled in the art that the foregoing and other changes in form and details may be made therein without departing from the spirit and scope of the invention.

What is claimed is:

1. A semiconductor memory device, comprising:
   a memory cell array having a plurality of memory cells accessed by an internal address;
   a plurality of redundant memory cells accessed by a failed cell address of a failed memory cell, the redundant memory cells being used for repairing the failed memory cell;
   a comparator for comparing data output from the memory cells during testing the semiconductor memory device as packaged and for generating a comparative output signal;
   a mode setting register for storing a failed cell address programming control signal in response to a mode control signal;
   an address generating circuit for generating the internal address by buffering and latching an externally applied address;

a failed cell address programming circuit for latching the internal address output from the address generating circuit in response to the failed cell address programming control signal when the comparative output signal indicates that a failed memory cell is detected in the semiconductor memory device and programming the latched internal address as the failed cell address; and a failed cell address coding circuit for generating a redundant memory cell selection signal when the internal address output from the address generating circuit and the failed cell address output from the failed cell address programming circuit correspond, wherein the redundant memory cell is accessed in response to the redundant memory cell selection signal.

2. The semiconductor memory device according to claim 1, wherein the failed cell address programming control signal includes a failed cell address latching control signal and a programming control signal.

3. The semiconductor memory device according to claim 2, wherein the failed cell address programming circuit includes:

address latching means for latching the failed cell address in response to the failed cell address latching control signal when the comparative output signal indicates that the failed memory cell is detected; and programming means for programming the failed cell address output from the address latching means in response to the programming control signal.

4. The semiconductor memory device according to claim 3, wherein the address latching means includes:

first address transferring means for transferring the external address in response to a combined signal produced by combining the comparative output signal with the failed cell address latching control signal; and a latching element for latching the external address output from the first address transferring means.

5. The semiconductor memory device according to claim 4, wherein the address latching means further includes a repair start signal generating circuit for generating a repair start signal in response to a combined signal that is produced by combining the comparative output signal with the failed cell address latching control signal.

6. The semiconductor memory device according to claim 2, wherein the programming means includes:

a second address transmitting means for transmitting address output from the failed cell address latching means in response to the programming control signal; and a failed cell address programming circuit for programming the failed cell address output from the second address transmitting means in response to the programming control signal.

7. The semiconductor memory device according to claim 6, wherein the failed cell address programming circuit includes:

a first fuse connected between a power supply voltage and a first node;

a first NMOS transistor connected between the first node and a ground voltage and having a gate to which the address output from the second address transmitting means is applied;

a first PMOS transistor connected between the first node and a second node and having a gate connected to a fourth node;

a second NMOS transistor connected between the second node and the ground voltage and having a gate connected to the fourth node;

a third NMOS transistor connected between the second node and the ground voltage and having a gate to which the programming control signal is applied;

a second fuse connected between the power supply voltage and a third node, a second PMOS transistor connected between the third node and the fourth node and having a gate connected to the second node;

fourth NMOS transistor connected between the fourth node and the ground voltage and having a gate connected to the second node; and a fifth NMOS transistor connected between the fourth node and the ground voltage and having a gate to which the programming control signal is applied.

8. A failed cell address programming circuit of a semiconductor memory device having a memory cell array having a plurality of memory cells accessed by an internal address, a plurality of redundant memory cells accessed by a failed cell address of a failed memory cell, a comparator for generating a comparative output signal after comparing data output from the memory cell array during testing the semiconductor memory device as packaged and an address generator for generating the internal address by buffering and latching an externally applied address, said failed cell address programming circuit comprising:

a mode setting register for storing a failed cell address latching control signal and a programming control signal which are externally applied in response to a mode control signal;

failed cell address latching means for latching address output from the address generator in response to the failed cell address latching control signal when the comparative output signal indicates that at least one of the memory cells has failed; and failed cell address programming means for programming the address output from the failed cell address latching means in response to the programming control signal.

9. The failed cell address programming circuit according to claim 8, wherein the failed cell address latching means includes:

a first address transmitting means for transmitting the failed cell address in response to a combined signal which is produced by combining the comparative accordance signal and the failed cell address latching control signal; and a latching element for latching the address output from the first address transmitting means.

10. The failed cell address programming circuit according to claim 9, wherein the failed cell address latching means further includes a repair start signal generating circuit for generating a redundant start signal in response to a combined signal which is produced by combining the comparative output signal with the failed cell address latching control signal.

11. The failed cell address programming circuit according to claim 8, wherein the failed cell address programming means includes:

a second address transmitting means for transmitting a second address output from the failed cell address latching means in response to the programming control signal; and a failed cell address programming circuit for programming a failed cell address output from the second address transmitting means in response to the programming control signal.

12. The failed cell address programming circuit according to claim 11, wherein the programming circuit includes:

a first fuse connected between a power supply voltage and a first node;

a first NMOS transistor connected between the first node and a ground voltage and having a gate to which the address output from the second address transmitting means is applied;

a first PMOS transistor connected between the first node and a second node and having a gate connected to a fourth node;

a second NMOS transistor connected between the second node and the ground voltage and having a gate connected to the fourth node;

a third NMOS transistor connected between the second node and the ground voltage and having a gate to which the programming control signal is applied;

a second fuse connected between the power supply voltage and a third node;

a second PMOS transistor connected between the third node and the fourth node and having a gate connected to the second node;

a fourth NMOS transistor connected between the fourth node and the ground voltage and having a gate connected to the second node; and a fifth NMOS transistor connected between the fourth node and the ground voltage and having a gate to which the programming control signal is applied.

13. A method for programming a failed cell address of a failed memory cell of a memory cell array with a plurality of memory cells accessed by an internal address, a plurality of redundant memory cells accessed by the failed cell address, a comparator for generating a comparative output signal after comparing data output from the memory cell array during testing of the semiconductor memory device as packaged and an address generator for generating the internal address by buffering and latching an externally applied address, said method comprising:

latching the internal address output from the address generator in response to the failed cell address latching control signal when the comparative output signal indicates that at least one memory cell has failed; and programming the internal address which is latched in response to the programming control signal.

14. The method according to claim 13, wherein the latching further includes generating a repair start signal in response to the failed cell address latching control signal when the comparative output signal indicates that at least one memory cell has failed during testing.

15. The method of claim 13, where the method is performed by a failed cell address programming circuit.

16. A semiconductor memory device, comprising:

a failed cell address programming circuit for latching an internal address from an address generating circuit in response to a failed cell address programming control signal when a failed memory cell is detected and programming the latched internal address as the failed cell address; and a failed cell address coding circuit for generating a redundant memory cell selection signal when an internal address and the failed cell address output from the failed cell address programming circuit correspond, wherein a redundant memory cell is accessed in response to the redundant memory cell selection signal.

17. The semiconductor memory device according to claim 16, wherein the failed cell address programming circuit includes:

address latching means for latching the failed cell address in response to the failed cell address latching control signal when the failed memory cell is detected; and programming means for programming the failed cell address output from the address latching means in response to the programming control signal.

18. The semiconductor memory device according to claim 17, wherein the address latching means includes:

first address transferring means for transferring an external address in response to a combined signal produced by combining a comparative output signal with the failed cell address latching control signal; and a latching element for latching the external address output from the first address transferring means.

19. The semiconductor memory device according to claim 18, wherein the address latching means further includes a repair start signal generating circuit for generating a repair start signal in response to a combined signal that is produced by combining the comparative output signal with the failed cell address latching control signal.

20. The semiconductor memory device according to claim 17, wherein the programming means includes:

a second address transmitting means for transmitting an address output from the failed cell address latching means in response to the programming control signal; and a failed cell address programming circuit for programming the failed cell address output from the second address transmitting means in response to the programming control signal.

* * * * *